US006929966B2

(12) United States Patent
Illek et al.

(10) Patent No.: US 6,929,966 B2
(45) Date of Patent: Aug. 16, 2005

(54) METHOD FOR PRODUCING A LIGHT-EMITTING SEMICONDUCTOR COMPONENT

(75) Inventors: Stefan Illek, Donaustauf (DE); Andreas Ploessl, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/723,266

(22) Filed: Nov. 25, 2003

(65) Prior Publication Data

US 2004/0259278 A1 Dec. 23, 2004

(30) Foreign Application Priority Data

Nov. 29, 2002 (DE) .......................................... 102 55 934
Feb. 20, 2003 (DE) .......................................... 103 07 280

(51) Int. Cl.[7] ............................................. H01L 21/00
(52) U.S. Cl. ........................... 438/29; 438/47; 438/572
(58) Field of Search ................................. 438/26, 29, 46, 438/47, 572, 643

(56) References Cited

U.S. PATENT DOCUMENTS

| 5,008,718 | A  | 4/1991  | Fletcher et al. | 257/96 |
|-----------|----|---------|------------------|--------|
| 6,277,713 | B1 | 8/2001  | Chao             | 438/46 |
| 6,323,063 | B2 | 11/2001 | Krames et al.    | 438/29 |
| 6,399,407 | B1 | 6/2002  | O'Brien et al.   | 438/29 |

2002/0017652 A1   2/2002   Illek et al.

FOREIGN PATENT DOCUMENTS

| DE | 44 01 858 C2   | 7/1995 |
| EP | 1 168 460 A2   | 1/2002 |
| WO | WO 02/13281 A1 | 2/2002 |

OTHER PUBLICATIONS

I Schnitzer et al., "30% External Quantum Efficiency from Surface Textured, Thin–film Light–emitting Diodes", Appl. Phys. Lett. 63 (16), Oct. 18, 1993, pp. 2174–2176.

*Primary Examiner*—Chandra Chaudhari
(74) *Attorney, Agent, or Firm*—Cohen, Pontani, Lieberman & Pavane

(57) ABSTRACT

A method for producing a light-emitting semiconductor component having a thin-film layer sequence (14), in which a photon-emitting active zone (17) is formed. The thin-film layer sequence (14) is formed on a growth substrate. A reflection contact layer (40) is formed having contact with the thin-film layer sequence. A diffusion barrier layer (42) is applied to the reflection contact layer (40), and a solder contact layer (44) is applied to the diffusion barrier layer (42). The reflection contact layer (40), after it has been formed and before the diffusion barrier layer (42) is applied, is subjected to heat treatment for the purpose of producing an ohmic contact, and the surface of the reflection contact layer (40) is cleaned with a first etching solution after the heat treatment. As an alternative, the reflection contact layer (40) is subjected to heat treatment after the application of the solder contact layer (44) to the diffusion barrier layer (42) for the purpose of producing an ohmic contact.

33 Claims, 3 Drawing Sheets

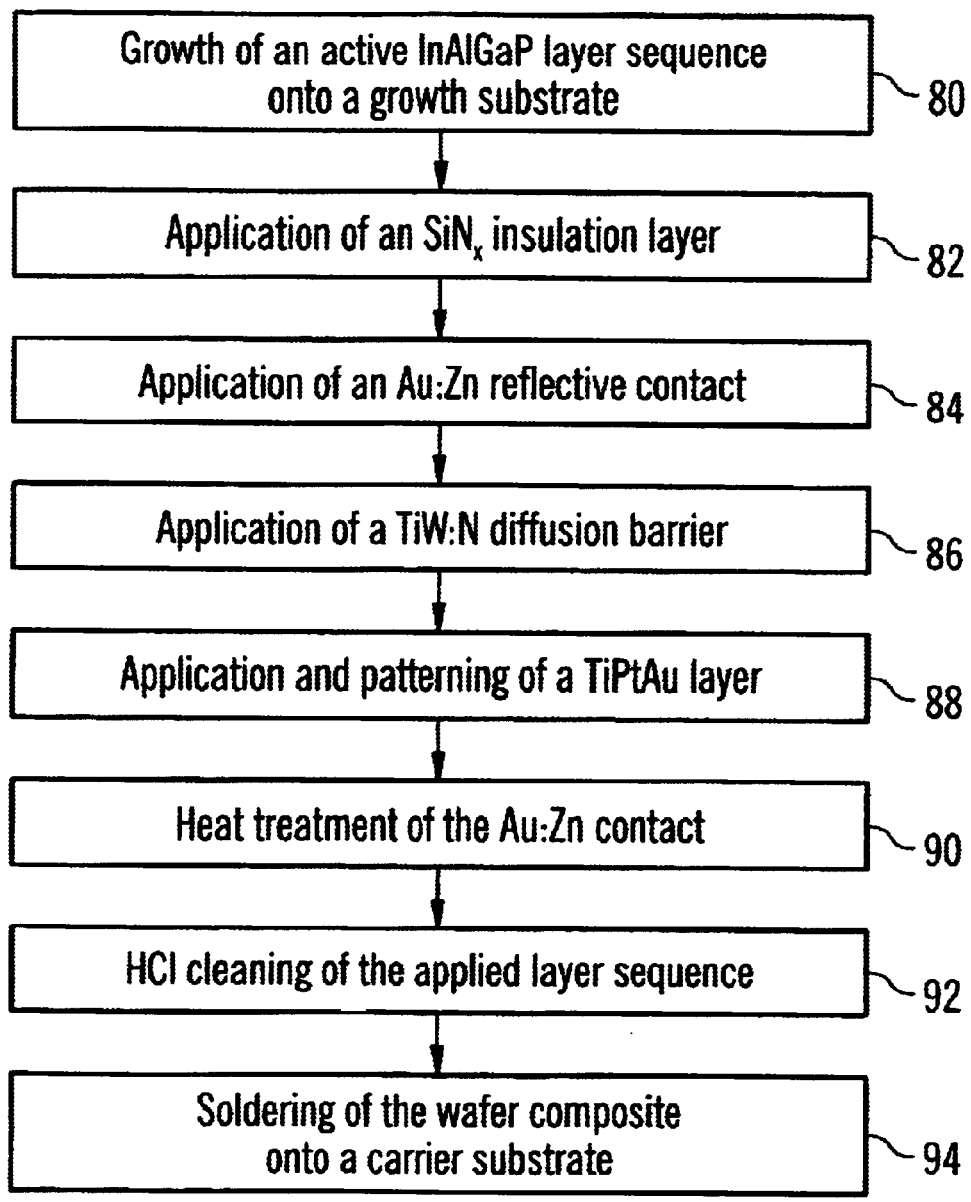

METHOD FOR PRODUCING A
LIGHT-EMITTING SEMICONDUCTOR
COMPONENT

This patent application claims the priority of German patent applications 10307280.2 and 10255934.1, the disclosure content of which is hereby incorporated by reference.

FIELD OF THE INVENTION

The invention relates to a method for producing a light-emitting semiconductor component having a thin-film layer sequence, in which a photon-emitting active zone is formed.

BACKGROUND OF THE INVENTION

In the method of the invention, a thin-film layer sequence having a photon-emitting active zone is grown on a growth substrate. A reflection contact layer is formed in such a way that it has contact with the thin-film layer sequence. A diffusion barrier layer is applied on the reflection contact layer, a solder contact layer being applied in turn to said diffusion barrier layer.

A method of this type is disclosed for example in WO 02/13281, the disclosure content of which is, in this respect, hereby incorporated by reference. In the method disclosed therein, a metallic reflector layer made of Au:Zn is applied to the thin-film layer sequence, to which reflector layer are applied a diffusion barrier layer made of TiW:N and a solder contact layer made of Au.

The entire layer sequence applied on the growth substrate during the method is usually cleaned with an etching cleaning agent. Overall, a thin-film component is produced by the wafer composite comprising growth substrate and applied layer sequence being applied to a carrier substrate in such a way that the layer sequence faces the carrier substrate. Afterwards, the growth substrate is at least partly removed.

The Au:Zn reflection contact layer is typically subjected to heat treatment after application, in order to form an ohmic contact. Only afterwards is the TiW:N layer sputtered on as the diffusion barrier layer.

In the just-described method there is the risk of wrinkling in the TiW:N layer after the cleaning or after the soldering of the wafer composite onto the carrier substrate because of a delamination at the TiW:N—Au:Zn interface.

SUMMARY OF THE INVENTION

One object of the invention is to provide a production method of the type described above which avoids wrinkling in the diffusion barrier layer to the greatest possible extent and increases the reliability of the thin-film light-emitting diodes thus produced.

This and other objects are attained in accordance with one aspect of the present invention directed to a method for producing a light-emitting semiconductor component having a thin-film layer sequence, in which a photon-emitting active zone is formed. The thin-film layer sequence is formed on a growth substrate. A reflection contact layer is formed which is in contact with the thin-film layer sequence. A diffusion barrier layer is applied to the reflection contact layer, and a solder contact layer is applied to the diffusion barrier layer. the reflection contact layer, after it has been formed and before the application of the diffusion barrier layer, is subjected to heat treatment for the purpose of producing an ohmic contact, and the surface of the reflection contact layer is cleaned with a first etching solution after the heat treatment.

Another aspect of the present invention is directed to a method for producing a light-emitting semiconductor component having a thin-film layer sequence, in which a photon-emitting active zone (17) is formed. The thin-film layer sequence is formed on a growth substrate, and a reflection contact layer is formed having contact with the thin-film layer sequence. A diffusion barrier layer is applied to the reflection contact layer, and a solder contact layer is applied to the diffusion barrier layer. After the application of the solder contact layer to the diffusion barrier layer, the reflection contact layer is subjected to heat treatment for the purpose of producing an ohmic contact.

Without being bound to a specific explanation, it is currently assumed that during the heat treatment of an Au:Zn reflective contact, as a result of segregation of Zn to the surface, a comparatively thick ZnO layer is produced on the surface of the Au:Zn contact. In this case, Auger electron spectra suggest a practically stoichiometric ZnO layer with a thickness of the order of magnitude of 10 nm.

It is further assumed that the applied diffusion barrier layer is at least partly permeable to an acidic cleaning agent, thus giving rise to the risk that during the cleaning step before the soldering onto the carrier substrate according to the conventional process, the ZnO layer will dissolve in the acidic medium and at least locally reduce the adhesion of the TiW:N diffusion barrier.

The cleaning step performed according to the invention after the heat treatment of the reflection contact layer counteracts the cause of the problem discussed. The first etching solution used for cleaning already etches away the ZnO layer on the reflection contact layer at least to a large extent before the application of the diffusion barrier layer. As a result, it is possible to produce an improved conductive contact between the thin-film layer sequence and the diffusion barrier layer and to effectively reduce a risk of wrinkling and possible delamination.

Preferably an acidic or basic solution, particularly preferably an aqueous HCl, $H_2SO_4$ or $NH_3$ solution, is used as the first etching solution.

The reflection contact layer is expediently cleaned with the first etching solution for 10 seconds to 10 minutes, preferably for 3 to 8 minutes, particularly preferably for about 5 minutes.

According to a preferred refinement of the method, the reflection contact layer is subjected to heat treatment at 400° C. to 600° C., preferably at about 450° C. In this case, the reflection contact layer may be subjected to heat treatment for about 1 to 20 min, preferably for about 13 min.

According to a further aspect of the invention, in a method of the type mentioned in the introduction, it is provided that only after the application of the solder contact layer to the diffusion barrier layer is the reflection contact layer subjected to heat treatment for the purpose of producing an ohmic contact.

If, after the deposition of the reflection contact layer, firstly the diffusion barrier layer is applied, then the solder contact layer is applied, and only afterwards is the ohmic contact formed by heat treatment, the lack of oxygen at the interface means that there is no segregation of Zn to the Au:Zn/diffusion barrier layer interface and formation of ZnO. Wrinkling in the diffusion barrier layer is thus avoided to the greatest possible extent, as in the first aspect of the invention, as a result of which improved contact formation can be achieved.

In both of the methods described above, it is preferably the case that before the reflection contact layer is formed, an insulation layer is applied to the thin-film layer sequence. Moreover, at least one hole for through-plating purposes is produced in the insulation layer and the reflection contact layer is subsequently formed on the insulation layer.

The insulation layer advantageously has at least one of the substances $SiN_x$, $SiO_x$, $SiO_xN_y$ and $Al_2O_3$. In this case, it is also expediently provided, for example, that the insulation layer essentially comprises one of said substances.

A layer which has or essentially comprises Au:Zn is advantageously applied as the reflection contact layer.

The diffusion barrier layer is preferably formed by a layer which has or essentially comprises TiW:N.

A layer or a layer stack which has or essentially comprises Ti, Pt and/or Au is expediently applied as the solder contact layer.

In a preferred refinement of the methods according to the invention, the applied layer sequence, comprising layers applied on the growth substrate, is at least partly cleaned with a second etching solution.

An aqueous HCl solution is particularly advantageously used as the second etching solution.

The layer sequence comprising at least the thin-film layer sequence and layers applied thereon is subsequently particularly preferably applied on a carrier substrate by the side on which the solder contact layer is applied. The growth substrate is at least partly removed before or after the application of the layer sequence on the carrier substrate, in order to form a thin-film semiconductor component.

The application of the layer sequence or of the wafer composite comprising the layer sequence and the growth substrate to the carrier substrate is preferably done by soldering or adhesive bonding.

In one development of the invention, at least one cavity is formed in the thin-film layer sequence from the carrier substrate, through which cavity a plurality of mesas are formed at the boundary between carrier substrate and thin-film layer sequence.

In this case, the at least one cavity is advantageously formed with a depth such that it cuts through the active zone of the thin-film layer sequence.

The thin-film layer sequence is preferably formed on the basis of $In_{1-x-y}Al_xGa_yP$ or on the basis of $In_{1-x-y}Al_xGa_yP$ and $Al_aGa_bAs$, where $0 \leq x \leq 1$, $0 \leq y \leq 1$, $0 \leq a \leq 1$, $0 \leq b \leq 1$ and $x+y \leq 1$, $a+b \leq 1$.

BRIEF DESCRIPTION OF THE DRAWINGS

The invention is explained in more detail below using exemplary embodiments in connection with the drawings.

FIG. 4 shows a flow diagram for carrying out another exemplary embodiment of a method according to the invention.

DETAILED DESCRIPTION OF THE DRAWINGS

Figure 1:
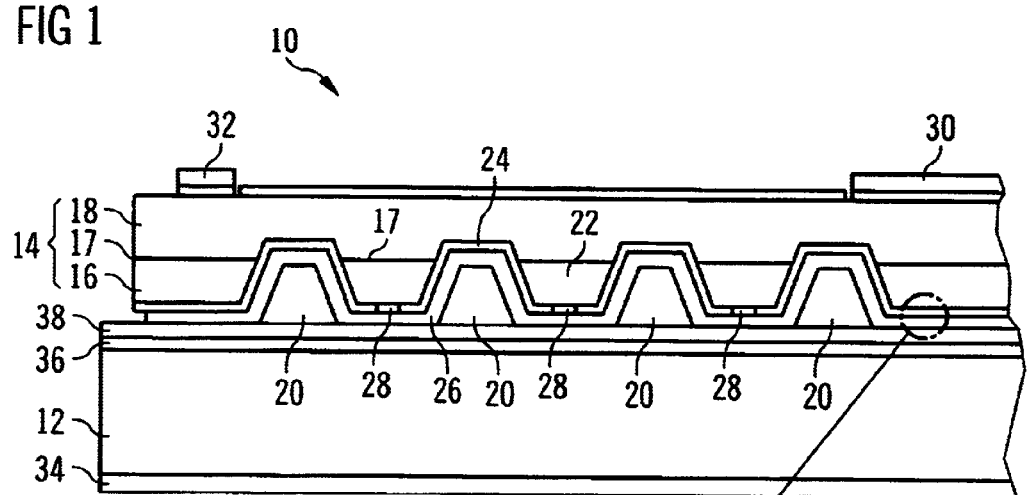
FIG. 1 shows a cross section through a thin-film light-emitting diode produced by a method according to the invention, in a diagrammatic illustration.

The light-emitting diode 10 in accordance with the exemplary embodiment of FIG. 1 has a carrier substrate 12, on which a thin-film layer sequence 14 is provided. In the exemplary embodiment, the thin-film layer sequence 14 comprises an n-InGaAlP layer 18, which is highly doped with Te to a concentration of $5 \times 10^{18}$ cm$^{-3}$ and has a layer thickness of about 4 µm, and an Mg-doped p-GaP layer 16 having a thickness of about 3.5 µm. The pn junction forms an active photon-emitting zone 17 in the thin-film layer sequence 14.

In order to increase the coupling-out of light, a plurality of cavities 20 are introduced into the thin-film layer sequence 14 from the carrier substrate 12, through which cavities a plurality of mesas 22 are formed at the boundary between carrier substrate 12 and thin-film layer sequence 14. In this case, the cavities 20 are formed with a depth such that they cut through the active zone 17 of the thin-film layer sequence 14.

An $SiN_x$ insulation layer 24, having a thickness of about 200 µm in the exemplary embodiment, is applied to the p-GaP layer 16 in the region both of the cavities 20 and of the mesas 22. For p-side feeding of current to the active zone 17, the insulation layer 24 is perforated by a plurality of holes 28 for through-plating purposes along the rear-side area of attachment to the carrier substrate 12.

Figure 2:
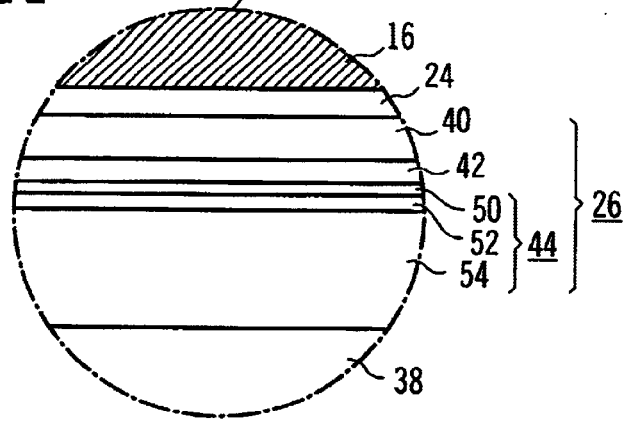
FIG. 2 shows a diagrammatic detail view of the light-emitting diode in the region of the boundary between the carrier substrate 12 and its thin-film layer sequence 14 shown in FIG. 1.

A partial layer sequence 26 is applied to the insulation layer 24, the precise composition of which sequence can best be discerned in the detail view of FIG. 2. In the exemplary embodiment shown, the partial layer sequence 26 comprises an Au:Zn layer having a thickness of about 600 nm as reflection contact layer 40, a TiW:N layer having a thickness of about 200 nm as diffusion barrier layer 42, and also a solder contact layer 44, which is composed of a Ti layer 50 having a thickness of about 100 nm, a Pt layer 52 having a thickness of about 100 nm and an Au layer 54 having a thickness of about 1000 nm. The solder contact layer 44 may be patterned after application.

In order to achieve a sufficient mechanical stability, the thin-film layer sequence 14 is soldered onto the conductive carrier substrate 12, which is formed by an n-GaAs substrate in the exemplary embodiment. Top side and underside of the carrier substrate 12 are provided with AuGe contact layers 34 and 36, respectively. On that side of the carrier substrate 12 which faces the thin-film layer sequence 14, a TiPtAu/AuSn layer 38 is applied on the AuGe contact layer 36.

The front or coupling-out side of the light-emitting diode 10 is provided with a central contact 30 and a metal frame 32, which is connected to the central contact 30 via two conductive webs (not illustrated). In the exemplary embodiment, the central contact 30 and the metal frame 32 are formed from a Ti/Pt/Au layer and a TiAuGe layer arranged between the latter and the thin-film layer sequence 14.

Figure 3:
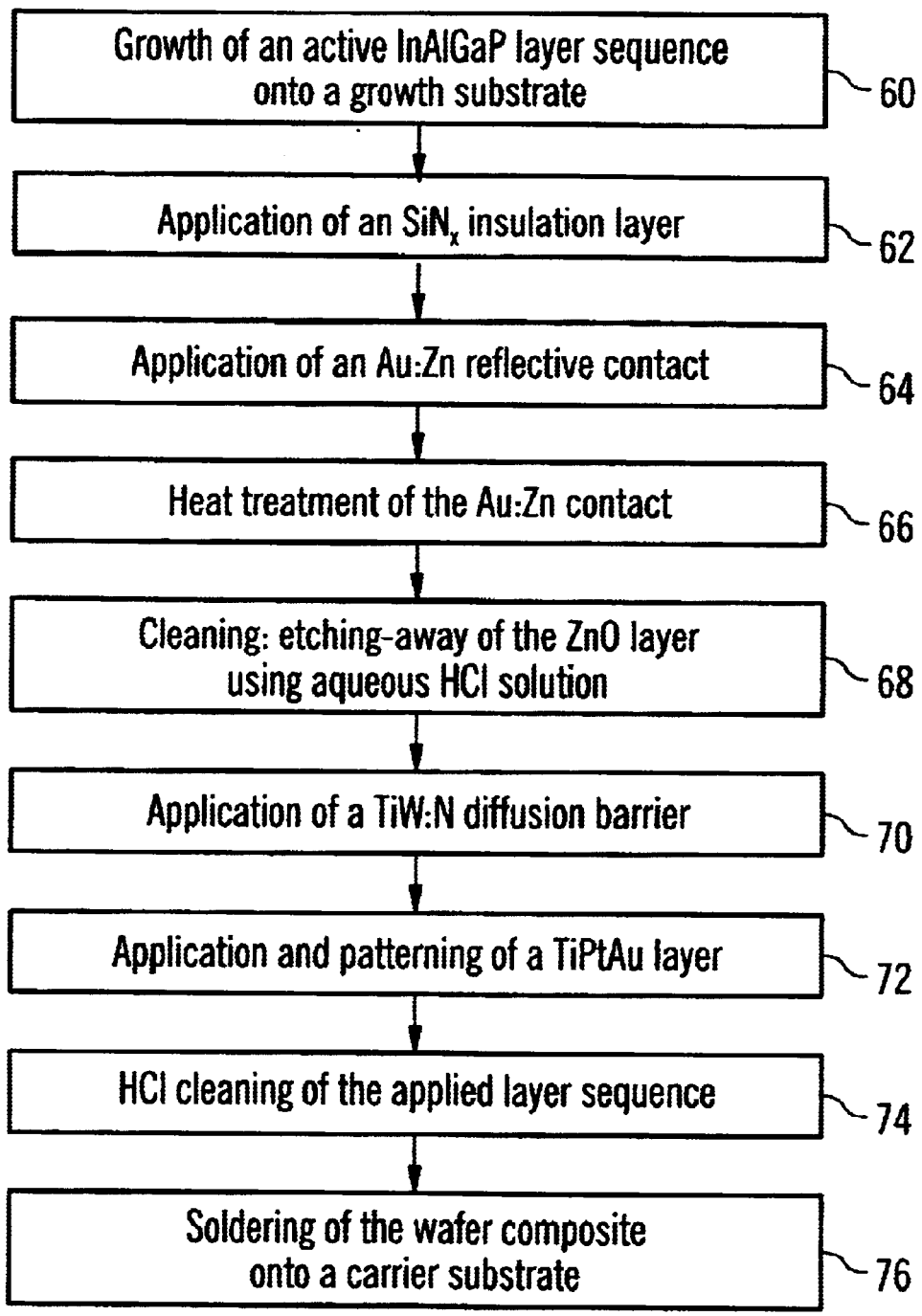
FIG. 3 shows a flow diagram for carrying out one exemplary embodiment of a method according to the invention.

A method for producing the light-emitting diode 10 of FIGS. 1 and 2 will now be described in connection with the flow diagram of FIG. 3.

In this case, in a step 60, the InAlGaP thin-film layer sequence, in the exemplary embodiment of FIG. 1 a thin-film layer sequence comprising Te-doped n-InGaAlP 18 and Mg-doped p-GaP 16, is grown onto the growth substrate. In step 62, the $SiN_x$ insulation layer 24 is then applied to the thin-film layer sequence.

In step 64, the Au:Zn reflection contact layer 40 is deposited. In step 66, the Au:Zn layer is then subjected to heat treatment at 450° C. for about 13 min in order to form an ohmic p-type contact. In this case, as explained further above, as a result of segregation of Zn to the surface of the Au:Zn layer, an almost stoichiometric ZnO layer having a thickness of about 10 nm forms at the surface of the reflection contact layer 40.

In the cleaning step 68, said ZnO layer is etched away in aqueous HCl solution (ratio of $HCl:H_2O=1:10$) with a time of action of 5 minutes. Afterwards, in step 70, the TiW:N diffusion barrier 42 is sputtered onto the cleaned Au:Zn layer by backsputtering.

Afterwards, in step 72, the Ti/Pt/Au layer stack 44 is applied and patterned. In step 74, the applied layers are cleaned with HCl before the wafer composite comprising growth substrate and applied layers is soldered onto the carrier substrate 12 in step 76.

The production method then proceeds in a manner that is known to the person skilled in the art. By way of example, after the removal of the growth substrate, an electrical contact connection 30, 32 is applied to the front side of the thin-film layer sequence 14. If a plurality of light-emitting diodes 10 are produced simultaneously in the manner that is customary, then the individual diode chips of the wafer are separated in a known manner.

A thin-film semiconductor component which can be produced in particular by a method according to the invention is distinguished in particular by the following characteristic features:

a reflective layer is applied or formed at a first main area—facing a carrier element—of a radiation-generating epitaxial layer sequence, said reflective layer reflecting at least part of the electromagnetic radiation generated in the epitaxial layer sequence back into the latter;

the epitaxial layer sequence has a thickness in the region of 20 $\mu$m or less, in particular in the region of 10 $\mu$m; and the epitaxial layer sequence contains at least one semiconductor layer having at least one area which has an intermixing structure which ideally leads to an approximately ergodic distribution of the light in the epitaxial layer sequence, i.e. it has an as far as possible ergodically stochastic scattering behaviour.

A basic principle of a thin-film light-emitting diode chip is described for example in I. Schnitzer et al., Appl. Phys. Lett. 63 (16), 18 Oct. 1993, 2174–2176, the disclosure content of which is in this respect hereby incorporated by reference.

However, a component produced by a method according to the invention need not necessarily be a thin-film semiconductor component having all the above features, although this is particularly advantageously provided.

An alternative method for producing a light-emitting diode as shown in FIGS. 1 and 2 is described in connection with the flow diagram of FIG. 4.

The first steps of this method are identical to those of the method described above. In particular, the InAlGaP thin-film layer sequence 14 is grown onto the growth substrate in step 80, the $SiN_x$ insulation layer 24 is applied to the thin-film layer sequence in step 82, and the Au:Zn reflection contact layer 40 is deposited on the insulation layer in step 84.

In contrast to the first method, however, the heat treatment of the Au:Zn layer is shifted in the process chain. The cleaning step provided after the heat treatment step in the case of the above method is also obviated as a result. Rather, after the deposition of the Au:Zn layer 40, firstly the TiW:N diffusion barrier 42 is sputtered on in step 86 and the Ti/Pt/Au layer stack 44 is applied and patterned in step 88. Only then is the ohmic p-type contact formed by heat treatment at 450° C. for about 13 min in step 90. The shifting of the heat treatment step in the process chain likewise avoids the segregation of Zn to the surface of the Au:Zn layer.

The further production method then follows the first method: in step 92, the applied layers are cleaned using HCl, and, in step 94, the wafer composite comprising growth substrate and applied layers is soldered onto the carrier substrate 12.

While the invention has been outlined and explained with reference to the production of thin-film light-emitting diodes, it will be unseparated to anyone with ordinary skill in the art that the above-described procedure can also be used in a different context, for example in the production of conventional light-emitting diode chips.

It is also readily apparent that the features of the invention which are disclosed in the description, in the drawings and also in the claims may be essential to the realization of the invention both individually and in every possible combination, even if this combination is not explicitly specified.

We claim:

1. Method for producing a light-emitting semiconductor component having a thin-film layer sequence (14), in which a photon-emitting active zone (17) is formed, comprising:

forming the thin-film layer sequence (14) on a growth substrate;

forming a reflection contact layer (40) having contact with the thin-film layer sequence (14);

applying a diffusion barrier layer (42) to the reflection contact layer (40);

applying a solder contact layer (44) to the diffusion barrier layer (42);

subjecting the reflection contact layer (40), after it has been formed and before the diffusion barrier layer (42) is applied, to heat treatment for producing an ohmic contact; and cleaning the surface of the reflection contact layer (40) with a first etching solution after the heat treatment.

2. Method according to claim 1, wherein the first etching solution is an acidic or basic solution.

3. Method according to claim 1, wherein the reflection contact layer (40) is cleaned with the first etching solution for a time interval in the range of 10 seconds to 10 minutes.

4. Method according to claim 1, wherein the reflection contact layer (40) is subjected to heat treatment at a temperature in the range of 400° C. to 600° C.

5. Method according to claim 1, wherein the reflection contact layer (40) is subjected to heat treatment for a time interval in the range of 1 minute to 20 minutes.

6. Method according to claim 1, wherein layers applied on the growth substrate are subsequently cleaned at least partly with a second etching solution.

7. Method according to claim 6, wherein an aqueous HCl solution is used as the second etching solution.

8. Method according to claim 1, wherein before the reflection contact layer is formed, an insulation layer (24) is applied to the thin-film layer sequence (14), at least one hole for through-plating purposes is formed in the insulation layer (24), and the reflection contact layer is formed on the insulation layer.

9. Method according to claim 8, wherein
a layer having at least one of the substances $SiN_x$, $SiO_x$, $SiO_xN_y$ and $Al_2O_3$ is applied as the insulation layer (24).

10. Method according to claim 1, wherein
a layer which has or essentially comprises Au:Zn is applied as the reflection contact layer (40).

11. Method according to claim 1, wherein
a layer which has or essentially comprises TiW:N is applied as the diffusion barrier layer (42).

12. Method according to claim 1, wherein
a layer stack (50, 52, 54) which has or essentially comprises Ti, Pt and/or Au is applied as the solder contact layer (44).

13. Method according to claim 1, wherein
a layer sequence comprising at least the thin-film layer sequence and layers applied thereon is subsequently applied on a carrier substrate by the side on which the solder contact layer is applied, and the growth substrate is at least partly removed before or after the application of the layer sequence on the carrier substrate, in order to form a thin-film semiconductor component.

14. Method according to claim 1, wherein
at least one cavity (20) is formed in the thin-film layer sequence (14) on the side remote from the growth substrate, through which cavity a plurality of mesas (22) are formed at the boundary between carrier substrate (12) and thin-film layer sequence (14).

15. Method according to claim 14, wherein
the at least one cavity (20) is formed with a depth such that it cuts through the active zone (17) of the thin-film layer sequence (14).

16. Method according to claim 1, wherein
the thin-film layer sequence (14) is formed on the basis of $In_{1-x-y}Al_xGa_yP$ or on the basis of $In_{1-x-y}Al_xGa_yP$ and $Al_aGa_bAs$, where $0 \leq x \leq 1$, $0 \leq y \leq 1$, $0 \leq a \leq 1$, $0 \leq b \leq 1$ and $x+y \leq 1$, $a+b \leq 1$.

17. Method for producing a light-emitting semiconductor component having a thin-film layer sequence (14), in which a photon-emitting active zone (17) is formed, comprising:
forming the thin-film layer sequence (14) on a growth substrate;
forming a reflection contact layer (40) having contact with the thin-film layer sequence (14);
applying a diffusion barrier layer (42) to the reflection contact layer (40); and
applying a solder contact layer (44) to the diffusion barrier layer (42);
wherein, after the solder contact layer (44) is applied to the diffusion barrier layer (42), the reflection contact layer (40) is subjected to heat treatment for producing an ohmic contact.

18. Method according to claim 17, wherein
layers applied on the growth substrate are subsequently cleaned at least partly with an etching solution.

19. Method according to claim 18, wherein
an aqueous HCl solution is used as the etching solution.

20. Method according to claim 17, wherein
before the reflection contact layer is formed, applying an insulation layer (24) to the thin-film layer sequence (14), forming at least one hole for through-plating purposes in the insulation layer (24), and forming the reflection contact layer on the insulation layer.

21. Method according to claim 20, wherein
a layer having at least one of the substances $SiN_x$, $SiO_x$, $SiO_xN_y$ and $Al_2O_3$ is applied as the insulation layer (24).

22. Method according to claim 17, wherein
a layer which has or essentially comprises Au:Zn is applied as the reflection contact layer (40).

23. Method according to claim 17, wherein
a layer which has or essentially comprises TiW:N is applied as the diffusion barrier layer (42).

24. Method according to claim 17, wherein
a layer stack (50, 52, 54) which has or essentially comprises Ti, Pt and/or Au is applied as the solder contact layer (44).

25. Method according to claim 17, wherein
a layer sequence comprising at least the thin-film layer sequence and layers applied thereon is subsequently applied on a carrier substrate (12) by the side on which the solder contact layer is applied, and the growth substrate is at least partly removed before or after the application of the layer sequence on the carrier substrate, in order to form a thin-film semiconductor component.

26. Method according to claim 25, wherein
at least one cavity (20) is formed in the thin-film layer sequence (14) on the side remote from the growth substrate, through which cavity a plurality of mesas (22) are formed at the boundary between said carrier substrate (12) and said thin-film layer sequence (14).

27. Method according to claim 26, wherein
the at least one cavity (20) is formed with a depth such that it cuts through the active zone (17) of the thin-film layer sequence (14).

28. Method according to claim 17, wherein
the thin-film layer sequence (14) is formed on the basis of $In_{1-x-y}Al_xGa_yP$ or on the basis of $In_{1-x-y}Al_xGa_yP$ and $Al_aGa_bAs$, where $0 \leq x \leq 1$, $0 \leq y \leq 1$, $0 \leq a \leq 1$, $0 \leq b \leq 1$ and $x+y \leq 1$, $a+b \leq 1$.

29. Method according to claim 2, wherein the first etching solution is one of the group of an aqueous HCl, $H_2SO_4$ and $NH_3$ solution.

30. Method according to claim 3, wherein
the first contact layer (40) is cleaned for a time interval in the range of 3 minutes to 8 minutes.

31. Method according to claim 30, wherein
the first contact layer (40) is cleaned for about 5 minutes.

32. Method according to claim 4, wherein
the reflection contact layer (40) is subjected to heat treatment at a temperature about 450° C.

33. Method according to claim 5, wherein
the reflection contact layer (40) is subjected to heat treatment for about 13 minutes.

* * * * *

UNITED STATES PATENT AND TRADEMARK OFFICE
CERTIFICATE OF CORRECTION

| | |
|---|---|
| PATENT NO. | : 6,929,966 B2 |
| APPLICATION NO. | : 10/723266 |
| DATED | : August 16, 2005 |
| INVENTOR(S) | : Stefan Illek et al. |

It is certified that error appears in the above-identified patent and that said Letters Patent is hereby corrected as shown below:

Col. 6, line 47, replace the expression "400°C." with the following:

-- 400°C --

Signed and Sealed this

Twentieth Day of February, 2007

JON W. DUDAS
*Director of the United States Patent and Trademark Office*